United States Patent [19]
Iijima

[11] Patent Number: 4,866,740
[45] Date of Patent: Sep. 12, 1989

[54] FREQUENCY DIVIDER OF PULSES USING RING-COUNTERS

[75] Inventor: Takashi Iijima, Tokyo, Japan

[73] Assignee: NEC Corporation, Tokyo, Japan

[21] Appl. No.: 137,705

[22] Filed: Dec. 24, 1987

[30] Foreign Application Priority Data

Dec. 24, 1986 [JP] Japan ................................ 61-314313

[51] Int. Cl.⁴ ..................... H03K 21/10; H03K 3/017
[52] U.S. Cl. ......................................... 377/47; 377/49; 377/56; 377/39; 307/265
[58] Field of Search ...................... 377/47, 48, 49, 118, 377/56, 39, 44, 6; 307/265

[56] References Cited

U.S. PATENT DOCUMENTS

| | | | |
|---|---|---|---|
| 3,609,311 | 9/1971 | Wayne | 377/6 |
| 3,697,879 | 10/1972 | Holliday | 307/265 |
| 3,745,315 | 7/1973 | Brendzel | 377/108 |
| 3,958,182 | 5/1976 | Sauthier | 307/265 |
| 3,980,960 | 9/1976 | Hutchinson | 307/265 |
| 4,330,751 | 5/1981 | Swain | 377/107 |
| 4,493,095 | 1/1985 | Yazawa | 377/114 |
| 4,596,027 | 6/1986 | Bernardson | 377/118 |

*Primary Examiner*—John S. Heyman
*Attorney, Agent, or Firm*—Sughrue, Mion, Zinn, Macpeak & Seas

[57] ABSTRACT

A frequency divider for dividing input pulses by a predetermined number is formed of an input means for receiving input pulses, a plural number of counters, each having a series connection of stages through which a count signal is respectively shifted in response to the input pulses. The numbers of series stages being selected so that they do not have any common divisor and have a minimum common multiple larger than the predetermined number pulse one. The frequency divider also includes a detecting means for detecting common occurrence of said count signals at selected stages of respective counters, and an output means for producing an output pulse in response to the detection by the detecting means.

9 Claims, 3 Drawing Sheets

FREQUENCY DIVIDER OF PULSES USING RING-COUNTERS

BACKGROUND OF THE INVENTION

1. Field of the Invention

This invention relates to a frequency divider of pulses using ring-counters and, more particularly, to a frequency divider suited for being used in a clock generator for solid-state imaging devices.

2. Description of the Related Art

The solid-state imaging devices such as Charge-Coupled Devices (CCD's) are constructed to a matrix of imaging elements, vertical shift registers disposed along each column of the imaging element matrix, a horizontal shift register receiving charges generated in the imaging elements through the vertical shift registers, and a charge-voltage converter producing an image signal in accordance with charges transferred from the horizontal shift register. The horizontal shift register is driven with horizontal clock pulses $\phi_{HfCK}$ having a repetition frequency larger than the color sub-carrier frequency $f_{sc}$ (i.e. 3.58 MHz in NTSC system). The repetition frequency of the horizontal clock pulses $\phi_{HfCK}$ is selected to be several integer times that of the color sub-carrier frequency $f_{sc}$.

For generating such horizontal clock pulses $\phi_{HfCK}$, a Phase-locked loop (PLL) is used. An output frequency of a voltage-controlled oscillator (VCO) is divided into a half to obtain the horizontal clock pulses $\phi_{HfCK}$. The obtained frequency is divided into one-505th. The divided signal is compared with a fixed frequency with a phase detector. The VCO is controlled with the output from the phase detector through a low-pass filter.

The frequency division into one-505th was conventionally achieved by a combination of a one-fifth divider and a one-101st divider. The divider combination is formed of binary counters which operate with various frequencies to generate various frequency noises. The noises affect the image signal to produce synchronous noises or fixed pattern noises on a reproduced picture.

SUMMARY OF THE INVENTION

A major object of the present invention is to provide a frequency divider of pulses which does not produce noises harmful for the normal operation of the apparatus using the frequency divider.

Another object of the invention is to provide a frequency divider of pulses which requires a small number of circuit elements and consumes a small power.

A further object of the invention is to provide a frequency divider of pulses suited for generating clock pulses for driving a solid-state image-sensor without deteriorating the reproduced picture.

According to a feature of the present invention, there is provided a frequency divider dividing frequency of pulses by a predetermined number, the frequency divider comprising an input means for receiving input pulses, a counter having a series of stages through which a count signal shifts to a neighboring stage in response to every one input pulse, a detecting means for detecting the counter signal at a preselected stage of the counter, the preselected stage being a stage which produces the counter signal when the input pulses of the predetermined number plus one are received, and an output means for producing an output signal in response to the detection by the detecting means.

The counter shifting one count signal through the series of stages in response to every input pulse. Therefore, noises having various frequencies are not produced. The operation of the apparatus using the frequency divider is not deteriorated by the noises.

According to another feature of the present invention, there is provided a frequency divider dividing frequency of input pulses by a predetermined number, the frequency divider comprising an input means for receiving the input pulses, a plural number of counters, each counter having a series of stages through which one count signal is respectively shifted in response to every input pulses, the numbers of series stages being selected so that the numbers have no common divisor and have a minimum common multiple larger than the predetermined number, a detecting means for detecting common occurrences of the count signals at selected stages of all the counters, the selected stages being stages producing the count signals in response to a reception of input pulses of the predetermined number plus one, an output means for generating an output pulse in accordance with the detection of the detector and a reset means for resetting all the counters in accordance with the detection of the detector.

The counters may be ring-counters or shift-registers and count input pulses by shifting one count signal along the series of stages in response to an application of the input pulses. Therefore, noises having various frequencies are not generated. Any synchronous noise or a fixed pattern noise does not appear on the reproduced image picture. Furthermore, a small number of stages are required for dividing input pulses by a large number. Thus, the frequency divider of pulses can be easily constructed in a semiconductor integrated circuit. The small number of stages consume a small amount of power and generate little heat. Even if a solid-state imaging device is disposed near the semiconductor integrated circuit including the frequency divider of the present invention, the solid-state imaging device is not thermally affected and does not deteriorate imaging property.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENT

Figure 1:
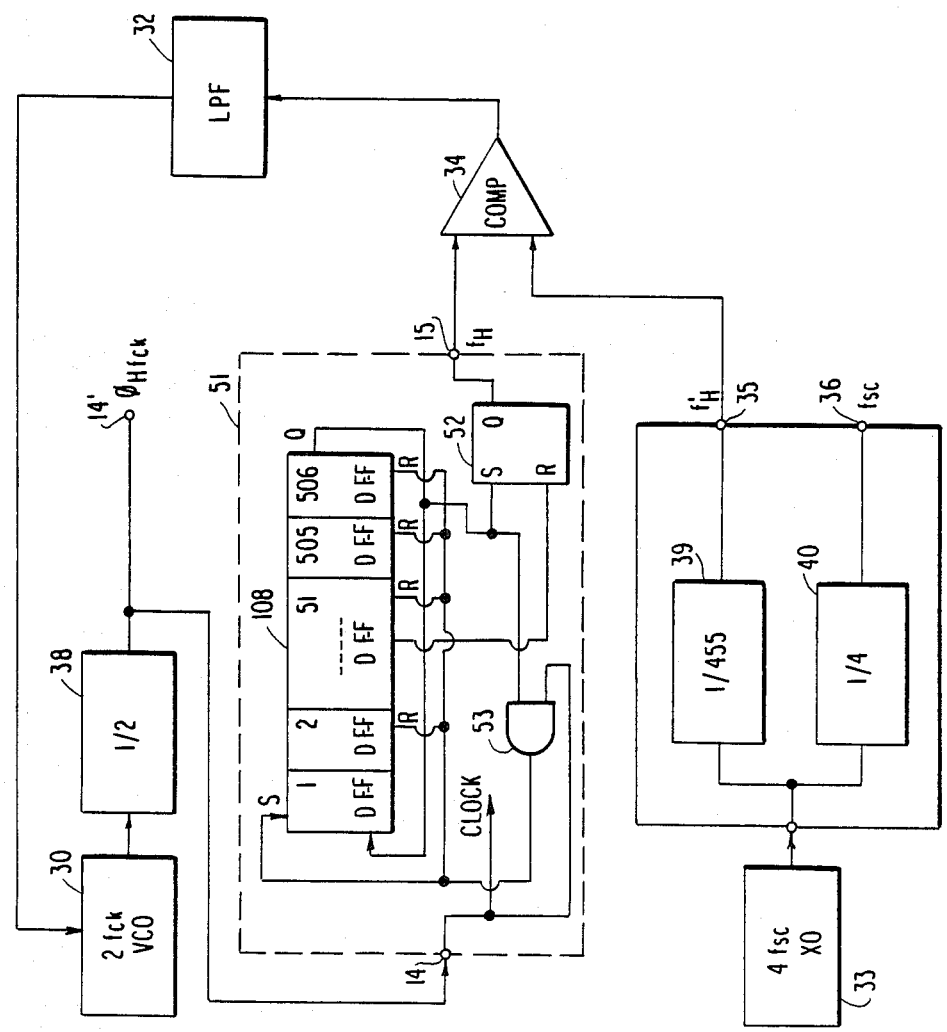
FIG. 1 is a block diagram of a horizontal clock generator using the frequency divider of pulses according to a first preferred embodiment of the present invention.

Referring to FIG. 1, a clock generator for producing horizontal clock pulses driving a horizontal CCD shift-register in a CCD imaging device includes a voltage controlled oscillator (VCO) 30, a frequency divider 38 dividing the frequency of the VCO output by two, a frequency divider 51 dividing the output of the ½ divider by 505, a phase detector 34, a low pass filter 32, a crystal oscillator 33, and a synchronous pulse generator 37. Those circuit elements form a Phase-Locked Loop. The crystal oscillator 33 oscillates at a frequency 4 $f_{sc}$ i.e.4 times of a color sub-carrier $f_{sc}$ (3.58 MHz). The output frequency 4 $f_{sc}$ is divided by four to obtain the color sub-carrier $f_{sc}$ at a terminal 36 by a frequency divider 40 in the synchronous pulse generator 37. The synchronous pulse generator 37 also divides the frequency 4 $f_{sc}$ by 455 by the frequency divider 39 to produce a synchronous pulse f'$_H$ at a terminal 35.

The VCO 30 oscillates at a frequency double of the horizontal clock pulses $\phi_{HfCK}$ under a control of an output from the low-pass filter 32. The output of the VCO 30 is divided by two by the frequency divider 38 to obtain the horizontal clock pulses $\phi_{HfCK}$ at a terminal 14'. The horizontal clock pulses $\phi_{HfCK}$ is applied to the frequency dividing section 51 through a terminal 14 to be divided by 505. The divided pulses $f_H$ is obtained at a terminal 15 and applied to the phase detector 34 together with the synchronous pulses f'$_H$ to be compared with each other. The compared output is applied to the low-pass filter 32 to control the oscillating frequency of the VCO 30.

A frequency divider 51 between the frequency divider 38 and the phase detector 34 divides the horizontal clock pulses $\phi_{HfCK}$ by 505 and has a ring-counter 108, an SR flip-flop 52 and anAND gate 53 according to the present invention. The ring-counter 108 has a series connection of 506 D flip-flops which operate with the horizontal clock pulses $\phi_{HfCK}$ as clock pulses. One D flip-flop in the series connection produces a count signal. In response to every horizontal clock pulses, the count signal is shifted to the next D flip-flop. Thus, when the 506th pulse of the clock pulses is applied to the ring-counter 108, the last D flip-flop produces the count signal to set the SR flip-flop 52. The SR flip-flop 52 has a reset terminal connected to a 51st D flip-flop and is reset at a time when the ring-counter 108 receives a next 50th horizontal clock pulse.

The AND gate 53 receives the count signal at the last stage D flip-flop and then sets the first stage D flip-flop to produce the count signal and resets the other stage D flip-flops in synchronism with the horizontal clock pulse. The SR flip-flop 52 produces the horizontal synchronization pulse $f_H$ by being set with the count signal at the last stage D flip-flop and being reset with the count signal at the 51st D flip-flop. The horizontal synchronization pulse $f_H$ has a repetition cycle having a time width of 505 horizontal clock pulses and a pulse width of 50 horizontal clock pulses.

The ring-counter 108 uniformly operates in synchronism with the horizontal clock pulses and does not generate noises having other frequency components. The operation of the ring-counter 108 synchronizes with every picture element in a reproduced picture which is imaged by a CCD area image sensor driven by the horizontal clock pulses $\phi_{HfCK}$ generated by the horizontal clock generator shown in FIG. 1. Therefore, the ring-counter 108 does not produce such noise that a fixed pattern noise appears in the reproduced picture. The D flip-flop is rather simple than the conventionally used flip-flop in the binary counters. The horizontal clock generator of the first preferred embodiment can be easily designed in a semiconductor integrated circuit. It is noted, here, that the ring-counter may be replaced with a shift-register having 506 series stages.

Figure 2:
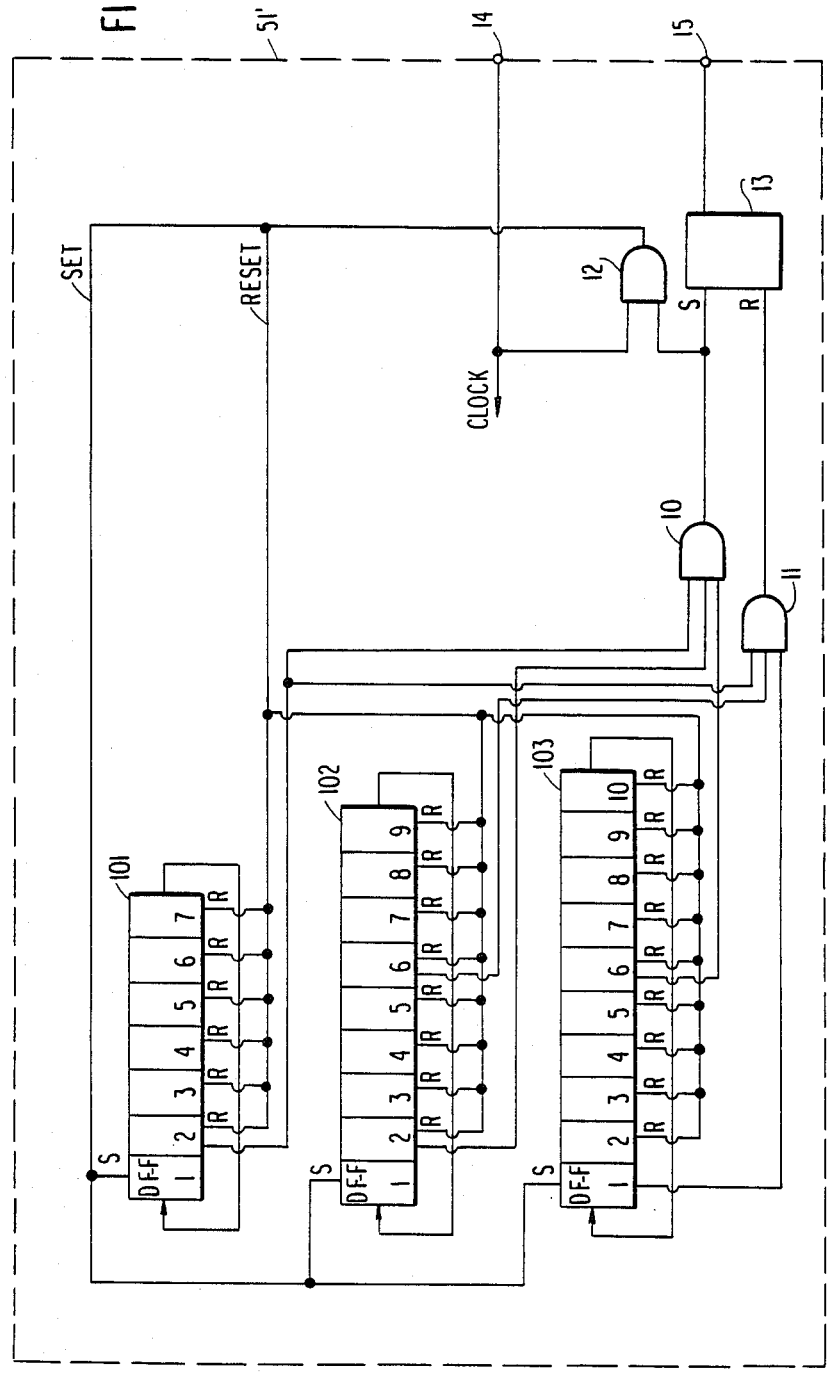
FIG. 2 is a block diagram showing a frequency dividing section using a frequency divider according to a second preferred embodiment, the frequency dividing section being replaceable with the same section in FIG. 1.

The second preferred embodiment of the present invention which will be explained in connection with using FIG. 2 which shows a frequency dividing section 51' formed of a fewer number of D flip-flops than the embodiment of FIG. 1. The frequency dividing section 51' in FIG. 2 is used in the horizontal clock generator by being replaced with the frequency dividing section 51 in FIG. 1.

The frequency dividing section 51' has three ring counters 101, 102 and 103. The ring-counter 101 has seven series-connected D flip-flops. Another ring counter 102 has nine series-connected D flip-flops. The remaining ring-counter 103 has ten series-connected D flip-flops. The numbers of the series connected D flip-flops in the ring-counters 101, 102 and 103 are selected so that the numbers do not have any common divisor and that the minimum common multiple is larger than the number of frequency division plus one, that is 506 in this embodiment. Tee frequency dividers 38, 39 and 40 are similarly formed by ring-counters.

The horizontal clock pulses $\phi_{HfCK}$ are applied to all the D flip-flops through the terminal 14 as their clocks. In response to the horizontal clock pulses $\phi_{HfCK}$, one count signal in each of the ring-counters 101, 102 and 103 shifts to the next D flip-flop. The output nodes of all the D flip-flops which produce the count signal at a reception of 506th horizontal clock pulse $\phi_{HfCK}$ are connected to an AND gate 10 to set an SR flip-flop 13. The output from the AND gate 10 is applied to an AND gate 12 to set the count signals in all the initial stage D flip-flops of all the ring-counters 101, 102 and 103 and reset all the remaining D flip-flops in synchronism with the horizontal clock pulse $\phi_{HfCK}$. The output nodes of all the D flip-flops which produce the count signal at a reception of 51st horizontal clock pulse $\phi_{HfCK}$ are connected to an AND gate 11 to reset the SR flip-flip 13. The SR flip-flop 13 produces a horizontal synchronizing pulse $f_H$ having a pulse width of 50 horizontal clock pulses $\phi_{HfCK}$ at the terminal 15.

The three ring-counters 101, 102 and 103 use a total of 26 D flip-flops much fewer than the series of 506 flip-flops shown in the FIG. 1 embodiment. Such a decreased number of D flip-flops occupies a small area of the frequency dividing section in a semiconductor chip of the horizontal clock generator of a CCD color imaging device. The decreased number further saves power consumption to keep the operating temperature low, so that the thermally generated carriers in the CCD color imaging device may not be changed, even if the horizontal clock generator IC is disposed near the CCD color imaging device.

Figure 3:
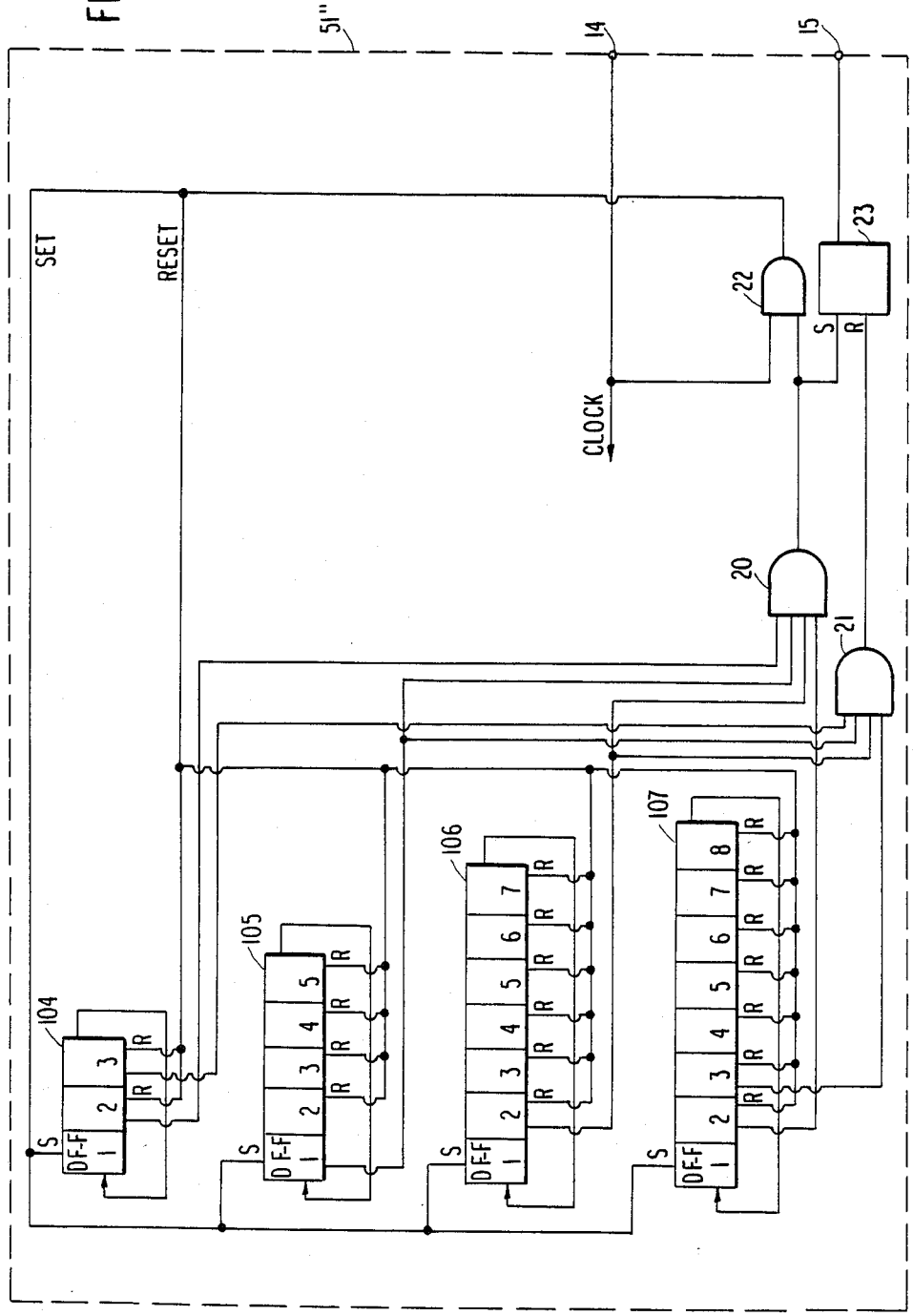
FIG. 3 is a block diagram showing another frequency dividing section using a frequency divider according to a third preferred embodiment, the frequency dividing section being also replaceable with the same section in FIG. 1.

The third preferred embodiment uses a frequency dividing section 51" of FIG. 3 in place of the frequency dividing section 51 of FIG. 1. The frequency dividing section 51" shows a case for dividing input pulses at the terminal 14 by 404. Four ring-counters 104, 105, 106 and 107 are used. The ring-counter 104 has three series-connected D flip-flops. The ring-counter 105 has five series-connected D flip-flops. The ring-counter 106 has seven series-connected D flip-flops. The ring-counter 107 has eight series-connected D flip-flops. The numbers of series-connected D flip-flops are selected so that they do not have any common divisor and have a minimum common multiple of 840 which is larger than 506. The output nodes of the second stage D flip-flops in the ring-counters 104, 106 and 107 and the output nodes of the initial stage D flip-flop in the ring-counter 105 are applied to an AND gate 20 to detect the 506th horizontal clock pulse $\phi_{HfCK}$. The detection signal of the AND gate 20 sets an SR flip-flop 23. The detection signal is also applied to another AND gate 22 together with the horizontal clock pulses HfCK to set the initial stage D flip-flops of the ring-counters 104, 105, 106 and 107 and resets the other D flip-flops, in synchronism with the horizontal clock pulses $\phi_{HfCK}$. The outputs nodes of the third stage D flip-flop in the ring-counter 104, the initial stage D flip-flop in the ring-counter 105, the second stage D flip-flop in the ring-counter 106 and the third stage D flip-flop in the ring-counter 107 are applied to an AND gate 21 to detect the 51st horizontal clock pulse $\phi_{HfCK}$. The detection signal from the AND gate 21 resets the SR flip-flop 23 to produce a horizontal synchronizing pulse having a pulse width of 50 horizontal clock pulses $\phi_{HfCK}$ at the terminal 15.

The frequency divider according to the third embodiment of the present invention uses 23 D flip-flops in total. The number of D flip-flops is reduced, compared to the cases using one or three ring-counters. Accordingly, the occupied area on a semiconductor chip of an integrated circuit and power consumption are more improved.

As explained, the frequency divider according to the present invention does not produce noises having various frequencies, and thus does not disturb the operation of the electrical apparatus using the frequency divider. Furthermore, in accordance with the second and third embodiments of the present invention, the number of required circuit elements is very small. The design of the frequency divider in a semiconductor integrated circuit is easily achieved with a small area on a semiconductor chip and a reduced power consumption. The reduced power consumption causes a small rise in operating temperature of circuit elements to restrain the generation of thermal carriers in a CCD imaging device driven by using the frequency divider. As a result, a picture having a stable picture quality can be reproduced.

The D flip-flops in the ring-counters may be replaced with other type of flip-flops such as JK flip-flops or SR flip-flops with a suitable circuit connection. Since the operation of the ring-counter is same as a shift-register, the ring-counters may be replaceable with shift-registers.

What is claimed is:

1. A frequency divider for dividing input pulses by a predetermined number comprising:
   an input means for receiving input pulses;
   a counter means for counting said received input pulses, said counter means comprising a plurality of counters each having series connections of stages through which one count signal shifts to a next stage in response to each counter receiving commonly applied input pulses, each stage having an output node for producing said count signal;
   a first detection means connected to the output nodes of first selected stages in each of said counters having said series connections to produce a first detection signal when said input pulses of said predetermined number plus one are received, the numbers of stages in said series connections being selected so that said numbers do not have a common divisor and have a minimum common multiple larger than aid predetermined number plus one;
   a second detection means connected to the output nodes of second selected stages in each of said counters having said series connections to produce a second detection signal when said input pulses of said predetermined number larger than one are received after said input pulses of said predetermined number plus one are received; and
   an output means for producing an output pulse in response to said first and second detection signals, said output means having a flip-flop set by said first detection signal and reset by said second detection signal.

2. A frequency divider as claimed in claim 1, wherein said first and second detection means are respectively an AND gate.

3. A frequency divider as claimed in claim 2, wherein said series connections are a first series connection of seven stages, a second series connection of nine stages and a third series connection of ten stages, said first and second detection means are each a three-input AND gate.

4. A frequency divider as claimed in claim 3, wherein said stages of said first, second and third series connections are D-type flip-flop.

5. A frequency divider as claimed in claim 2, wherein the number of said plurality of said series connections is four, said detection means being a four-input AND gate.

6. A frequency divider as claimed in claim 5, wherein said series connections are a fourth series connection of three stages, a fifth series connection of five stages, a sixth series connection of seven stages and a seventh series connection of eight stages, said first and second detection means are each a four-input AND gate.

7. A frequency divider as claimed in claim 6, wherein said stages of said fourth, fifth, sixth and seventh series connections are D-type flip-flop.

8. A frequency divider dividing input pulses by a first predetermined number comprising:
   an input means for receiving said input pulses;
   first, second and third counters counting said input pulses, said first counter having a series connection of seven D-type flip-flops through which a first count signal is shifted in response to every of said input pulses, said second counter having a series connection of nine D-type flip-flops through which a second count signal is shifted in response to every of said input pulses, and said third counter having a series connection of ten D-type flip-flops through which a third count signal is shifted in response to every of said input pulses;
   a first AND gate having three inputs each connected to selected stages in said first, second and third counters, said selected stages producing said first, second and third count signals, respectively, when said input pulses of said first predetermined number plus one are received;
   a second AND gate having two input receiving the output from said first AND gate and said input pulses to set all the first stage D-type flip-flops in said first, second and third counters in synchronism, with said input pulses;
   an output means for producing an output pulse in response to the output from said first AND gate; and
   a third AND gate having three inputs connected to further-selected stages in said first, second and third counters, said further-selected stages producing said first, second and third count signals, respectively, when said input pulses of a second predetermined number are received, and said output means being a set-reset flip-flop set by the output from said first AND gate and reset by the output from said third AND gate.

9. A frequency divider dividing input pulses by a first predetermined number comprising;

an input means for receiving said input pulses;

first, second, third and fourth counters counting said input pulses, said first counter having a series connection of three D-type flip-flops through which a first count signal is shifted in response to every of said input pulses, said second counter having a series connection of five D-type flip-flops through which a second count signal is shifted in response to every of said input pulses, said third counter having a series connection of seven D-type flip-flops through which a third count signal is shifted in response to every of said input pulses and said fourth counter having a series connection of eight D-type flip-flops through which a fourth count signal is shifted in response to every of said input pulses;

a first AND gate having four inputs each connected to selected stages in said first, second, third and fourth counters, and selected stages producing said first, second, third and fourth count signals, respectively, when said input pulses of said first predetermined number plus one are received;

a second AND gate having two inputs for receiving the output from said first AND gate and said input pulses, respectively, to set all the first stage D-type flip-flops in said first, second, third and fourth counters in synchronism with said input pulses;

an output means for producing an output pulse in response to the output from first AND gate; and a third AND gate having four inputs connected to further-selected stages in said first, second, third and fourth counters, said further-selected stages producing said first, second, third and fourth count signals, respectively, when said input pulses of a second predetermined number are received, and said output means being a set reset flip-flop set by the output from said first AND gate and reset by the output from said third AND gate.

* * * * *